(12) United States Patent
Huang et al.

(10) Patent No.: US 11,615,993 B2
(45) Date of Patent: Mar. 28, 2023

(54) CLUSTERING SUB-CARE AREAS BASED ON NOISE CHARACTERISTICS

(71) Applicant: KLA CORPORATION, Milpitas, CA (US)

(72) Inventors: Boshi Huang, San Jose, CA (US); Hucheng Lee, Cupertino, CA (US); Vladimir Tumakov, El Dorado Hills, CA (US); Sangbong Park, Dublin, CA (US); Bjorn Brauer, Beaverton, OR (US); Erfan Soltanmohammadi, Felton, CA (US)

(73) Assignee: KLA CORPORATION, Milpitas, CA (US)

( * ) Notice: Subject to any disclaimer, the term of this patent is extended or adjusted under 35 U.S.C. 154(b) by 305 days.

(21) Appl. No.: 17/093,621

(22) Filed: Nov. 9, 2020

(65) Prior Publication Data

US 2021/0159127 A1    May 27, 2021

Related U.S. Application Data

(60) Provisional application No. 62/938,843, filed on Nov. 21, 2019.

(51) Int. Cl.
| | |
|---|---|
| *G06T 7/00* | (2017.01) |
| *H01L 21/66* | (2006.01) |
| *G06K 9/62* | (2022.01) |
| *G06F 17/18* | (2006.01) |
| *G06F 7/22* | (2006.01) |

(52) U.S. Cl.
CPC ............... *H01L 22/12* (2013.01); *G06F 7/22* (2013.01); *G06F 17/18* (2013.01); *G06K 9/6226* (2013.01); *G06T 7/0004* (2013.01); *G06T 2207/20021* (2013.01); *G06T 2207/20076* (2013.01); *G06T 2207/20224* (2013.01); *G06T 2207/30148* (2013.01)

(58) Field of Classification Search
CPC . H01L 22/12; H01L 22/20; G06F 7/22; G06F 17/18; G06K 9/6226; G06K 9/6219; G06K 9/6284; G06T 7/0004; G06T 2207/20021; G06T 2207/20076; G06T 2207/20224; G06T 2207/30148; G06T 7/001; G06V 10/7625; G06V 10/764
See application file for complete search history.

(56) References Cited

U.S. PATENT DOCUMENTS

| | | | |
|---|---|---|---|
| 5,317,420 A * | 5/1994 | Kuwahara | G06T 5/20 |
| | | | 382/163 |
| 8,781,781 B2 | 7/2014 | Kulkarni et al. | |
| 8,923,600 B2 | 12/2014 | Zafar et al. | |

(Continued)

FOREIGN PATENT DOCUMENTS

JP      5460662 B2      4/2014

OTHER PUBLICATIONS

WIPO, ISR for PCT/US2020/060810, Mar. 11, 2021.

*Primary Examiner* — Aaron W Carter
(74) *Attorney, Agent, or Firm* — Hodgson Russ LLP

(57) ABSTRACT

A care area is determined in an image of a semiconductor wafer. The care area is divided into sub-care areas based on the shapes of polygons in a design file associated with the care area. A noise scan of a histogram for the sub-care areas is then performed. The sub-care areas are clustered into groups based on the noise scan of the histogram.

19 Claims, 14 Drawing Sheets

(56) References Cited

U.S. PATENT DOCUMENTS

| | | | |
|---|---|---|---|
| 9,846,930 B2 | 12/2017 | Wu et al. | |
| 10,832,396 B2* | 11/2020 | Duffy | G06T 7/0006 |
| 2008/0205745 A1* | 8/2008 | Chen | G06T 7/187 |
| | | | 382/145 |
| 2010/0119144 A1* | 5/2010 | Kulkarni | G06F 30/30 |
| | | | 382/149 |
| 2010/0329540 A1 | 12/2010 | Bhaskar et al. | |
| 2014/0376801 A1* | 12/2014 | Karsenti | G06T 7/001 |
| | | | 382/145 |
| 2015/0012900 A1* | 1/2015 | Shifrin | G06F 30/398 |
| | | | 716/112 |
| 2015/0221076 A1 | 8/2015 | Gao et al. | |
| 2015/0324964 A1* | 11/2015 | Shifrin | G06T 7/001 |
| | | | 382/151 |
| 2016/0104600 A1* | 4/2016 | Luo | G05B 19/401 |
| | | | 250/310 |
| 2016/0377561 A1 | 12/2016 | Ramachandran et al. | |
| 2017/0169552 A1* | 6/2017 | Brauer | G06T 7/001 |
| 2017/0206650 A1* | 7/2017 | Kulkarni | G06T 7/001 |
| 2018/0218490 A1* | 8/2018 | Lin | G06T 7/0004 |
| 2019/0080447 A1* | 3/2019 | Shkalim | G06T 7/0006 |
| 2019/0287015 A1* | 9/2019 | Plihal | G01N 21/8851 |
| 2019/0287238 A1 | 9/2019 | Sriraman | |
| 2019/0318949 A1* | 10/2019 | Banerjee | G01N 21/9501 |
| 2020/0126212 A1 | 4/2020 | Duffy et al. | |
| 2021/0010945 A1* | 1/2021 | Brauer | G06T 7/001 |
| 2021/0097666 A1* | 4/2021 | Brauer | G06T 7/001 |
| 2021/0159127 A1* | 5/2021 | Huang | G06T 7/0004 |
| 2021/0312630 A1* | 10/2021 | Asadizanjani | G06T 7/11 |

* cited by examiner

CLUSTERING SUB-CARE AREAS BASED ON NOISE CHARACTERISTICS

CROSS-REFERENCE TO RELATED APPLICATIONS

This application claims priority to the provisional patent application filed Nov. 21, 2019 and assigned U.S. App. No. 62/938,843, the disclosure of which is hereby incorporated by reference.

FIELD OF THE DISCLOSURE

This disclosure relates to semiconductor wafer inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

To have more targeted inspection, the parameters should be set differently for different areas of wafers or reticles. This area of interest is known as the "care area" and is defined by the user based on design and process characteristics. The term "care areas" can be generally defined as areas on the wafer that a user cares about for some reason and, therefore, should be inspected. In an example of currently used care areas, care areas for one layer of a wafer may be defined such that the care areas include critical features that are formed on the layer and do not include non-critical features that are formed on the layer. Care areas can vary in size and shape. In an instance, the care areas are inspected with higher sensitivity.

To increase sensitivity, care areas with higher chance of failure or with more critical circuitry tasks may be inspected with deeper detection thresholds. After the user defines care areas, each care area can be divided into hundreds or thousands of smaller parts known as "sub-care areas." As shown in FIG. 1, the care areas can be separated into two or more different sub-care areas. Each sub-care areas may be one or more pixels within the care area.

Clustering sub-care areas poses particular challenges. Previously, care area grouping involved directly calculating the sigma with standard normal distribution formula or only using the mean and sigma to calculate the distance between difference sub-care areas.

Previous grouping techniques assumed the data obeyed a standard normal distribution, and then calculated the sigma based on the standard normal distribution formula. However, the data does not always obey the normal distribution, which impacts the accuracy of sigma and misleads the grouping. Previous techniques also only used mean and sigma, which ignored the 3-sigma and 4-sigma information. 3-sigma and 4-sigma may have a higher correlation with defect detection. Previous techniques also did not consider the population (number of pixel) when performing grouping. A larger population dominated the clustered sigma.

Therefore, new methods and systems for clustering sub-care areas are needed.

BRIEF SUMMARY OF THE DISCLOSURE

A method is provided in a first embodiment. The method includes generating an image of a semiconductor wafer using a wafer inspection tool. The image of the semiconductor wafer is received at a processor. A care area in the image is determined using the processor. The care area is divided into sub-care areas using the processor based on shapes of polygons in a design file associated with the care area. A noise scan of a histogram is performed for the sub-care areas using the processor. The noise scan of the histogram is based on a difference image between the image and a reference image at the sub-care area. The sub-care areas is clustered into groups using the processor based on the noise scan of the histogram.

The method can further include determining, using the processor, if a defect is present at a pixel of one of the sub-care areas.

In an instance, the clustering further includes determining a bandwidth of the histogram between density points at each end of the histogram using the processor and determining a median, a maximum, and a minimum of the bandwidth using the processor. In this instance, the cluster can further include generating a dendrogram based on the groups and adjusting a cutline on the dendrogram until all groups satisfy a data sufficiency constraint.

In another instance, the clustering further includes: determining a mean, a first threshold, and a second threshold of the noise scan; clustering the sub-care areas for each die into a first category between the mean and first threshold and a second category between the first threshold and second threshold; and determining consistency of populations based on the clustering using the processor. The first threshold and the second threshold are less than 4-sigma from the mean. In this instance, the method can further include merging dies of the sub-care areas using the processor. The first threshold and the second threshold can each be one of 1-sigma, 3-sigma, and 4-sigma. The clustering can further include: clustering the groups with a statistical point-based 1-sigma to generate a first output; clustering the first output with a statistical point-based 3-sigma to generate a second output; and clustering the second output with a statistical point-based 4-sigma.

The determining the group of sub-care areas can be across a row of dies on the semiconductor wafer.

The method can further include combining two of the sub-care areas, wherein detectability of the two of the sub-care areas is approximately unchanged after the combining.

A non-transitory computer readable medium can store a program configured to instruct a processor to execute the method of the first embodiment.

A system is disclosed in a second embodiment. The system comprises a light source; a stage configured to hold a semiconductor wafer; a detector configured to receive light from the light source reflected off the semiconductor wafer; and a processor in electronic communication with the detector. The processor is configured to: receive an image of the semiconductor wafer using data from the detector; determine a care area in the image; divide the care area into sub-care areas based on shapes of polygons in a design file associated with the care area; perform a noise scan of a histogram for the sub-care areas; and cluster the sub-care areas into groups based on the noise scan of the histogram. The noise scan of the histogram is based on a difference image between the image and a reference image at the sub-care area.

The processor can be further configured to determine if a defect is present at a pixel of one of the sub-care areas.

In an instance, the clustering can further include determining a bandwidth of the histogram between density points at each end of the histogram using the processor and determining a median, a maximum, and a minimum of the bandwidth using the processor.

In another instance, the clustering can further include: determining a mean, a first threshold, and a second threshold of the noise scan; clustering the sub-care areas into a first category between the mean and first threshold and a second category between the first threshold and second threshold; and determining consistency of populations based on the clustering using the processor. The first threshold and the second threshold are less than 4-sigma from the mean. The first threshold and the second threshold can each be one of 1-sigma, 3-sigma, and 4-sigma. The clustering also can further include: clustering the groups with a statistical point-based 1-sigma to generate a first output; clustering the first output with a statistical point-based 3-sigma to generate a second output; and clustering the second output with a statistical point-based 4-sigma.

The determining the group of sub-care areas can be across a row of dies on the semiconductor wafer.

The processor can be further configured to combine two of the sub-care areas, wherein detectability of the two of the sub-care areas is approximately unchanged after the combining.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

During wafer inspection, a care area can be split into thousands of sub-care areas. The sub-care areas can be grouped based on process criteria. Sub-care area groups ("sub CAGs") are assigned to a different region to perform a defection detection. Dividing a care area into many sub-care areas introduces significant data insufficiency. This can severely impair a detection algorithm that needs enough data to find the meaningful thresholds.

Clustering embodiments disclosed herein can improve inspection sensitivity and suppress nuisance. Distribution of the difference image can be used. In an instance, statistical point at sigma also can be used, which can reflect the real characteristic of the difference image distribution. Data in the sub-care area groups do not always obey normal distribution. Statistical point based 3-sigma and 4-sigma information can be used with the mean and 1-sigma. These embodiments can use the statistical point-based sigma other than the sigma that was calculated based on the assumption of standard normal distribution. Population can be accounted for when clustering. In another instance, noise clouds that are less spread in diff also can be used, which can increase the chance of detecting deep defects. Clustering to group sub-care areas based on their noise cloud or statistical point-based sigma can solve data insufficiency and to have minimal impact on sensitivity.

Figure 1:
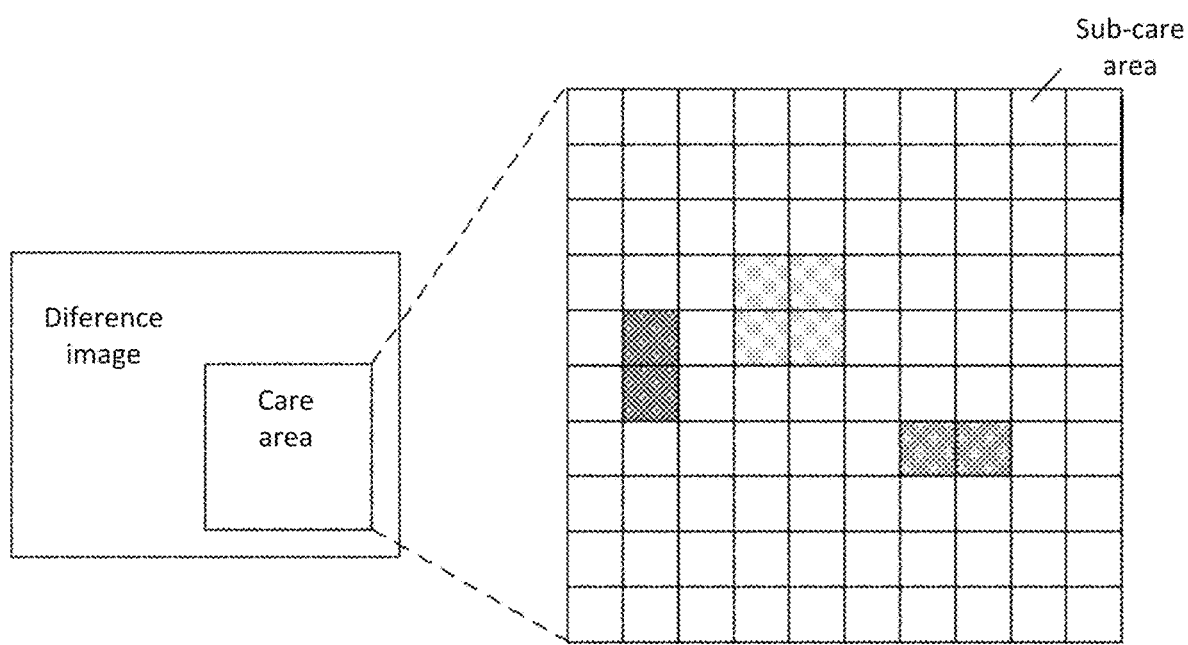
FIG. 1 is diagram shows an exemplary care area and sub-care areas.
Figure 2:
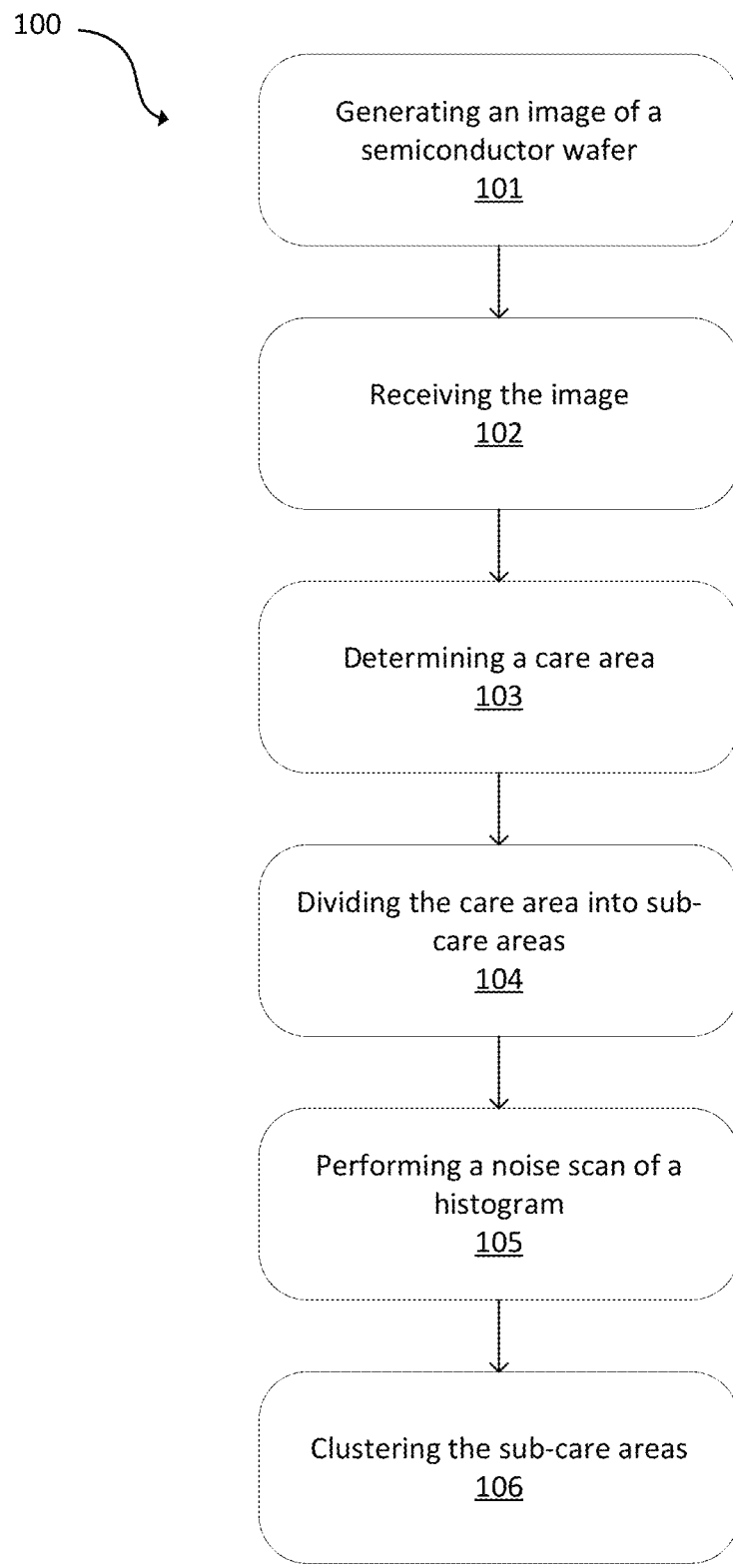
FIG. 2 is a flowchart of an embodiment of a method in accordance with the present disclosure.

FIG. 2 is a flowchart of method 100. Some or all of the steps of the method 100 can use a processor. At 101, an image of a semiconductor wafer is generated using a wafer inspection tool. The image is received at 102.

The processor can be used to determine a care area in the image at 103. The care area may be focused on a die or part of a die on the semiconductor wafer. The care area can then be divided into sub-care areas using the processor based on shapes of polygons in a design file associated with the care area. The semiconductor wafer includes various features (e.g., lines, vias) that exist as polygons in the design file. The polygons can vary between different semiconductor devices or even different parts of the same semiconductor device. The group of sub-care areas can be across a row of dies on the semiconductor wafer.

A noise scan of a histogram is performed at 105. The noise scan finds a difference grey level for each pixel in the care area groups. The histogram is for the sub-care areas. The noise scan of the histogram can be based on a difference image between a test image and a reference image at the sub-care area. The difference image may be used to highlight differences in the actual semiconductor device compared to a reference.

At 106, the sub-care areas are clustered into groups based on the noise scan of the histogram. For example, the groups can be based on similar characteristics, such as the distance of the sigma values or other parameters.

The clustering can include determining a bandwidth of the histogram between density points at each end of the histogram with a median, a maximum, and a minimum of the bandwidth.

The clustering also can include determining a mean, a first threshold, and a second threshold of the noise scan. The first threshold and the second threshold are less than 4-sigma from the mean. The sub-care areas for each die can be clustered into a first category between the mean and first threshold and a second category between the first threshold and second threshold. Consistency of populations based on the clustering can be determined and dies of the sub-care areas can be merged. For example, the first threshold and the second threshold are each one of 1-sigma, 2-sigma, 3-sigma, or 4-sigma.

Two of the sub-care areas can be combined. Detectability of the two of the sub-care areas may be approximately unchanged after the combining.

Figure 3:
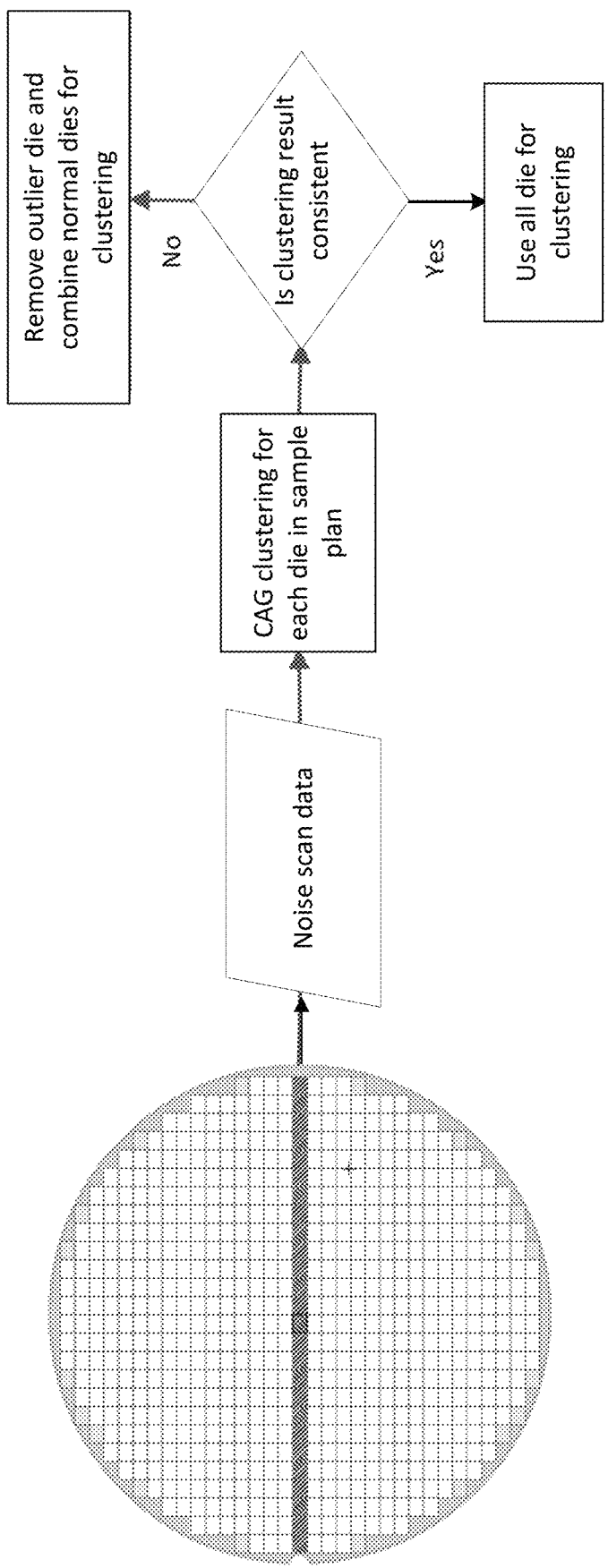
FIG. 3 is a diagram of an embodiment of sub-care area clustering.

FIG. 3 is a diagram of an embodiment of sub-care area clustering. As seen in FIG. 3, a noise scan is performed and data is collected for all sub-care areas for each die. The histogram of difference images between test images and a reference image can be determined.

In a first embodiment, sub-care areas can be used as input. During the noise scan, the difference image between the candidate die and the reference image can be obtained. The difference image histogram can be determined from the difference image. Mean and sigma of the distribution can then then calculated.

After getting the histogram of the difference image, statistical points such as 1-sigma, 3-sigma, 4-sigma, and mean are determined. These are merely examples of statistical points. Other statistical points like, for example, percentile, a target density, or a certain count per difference grey level can be used.

The calculation of statistical point-based sigma is based on the standard normal distribution as shown below.

$$f(x) = \frac{1}{\sigma\sqrt{2\pi}} e^{-\frac{1}{2}(\frac{x-\mu}{\sigma})^2}$$

Figure 5:
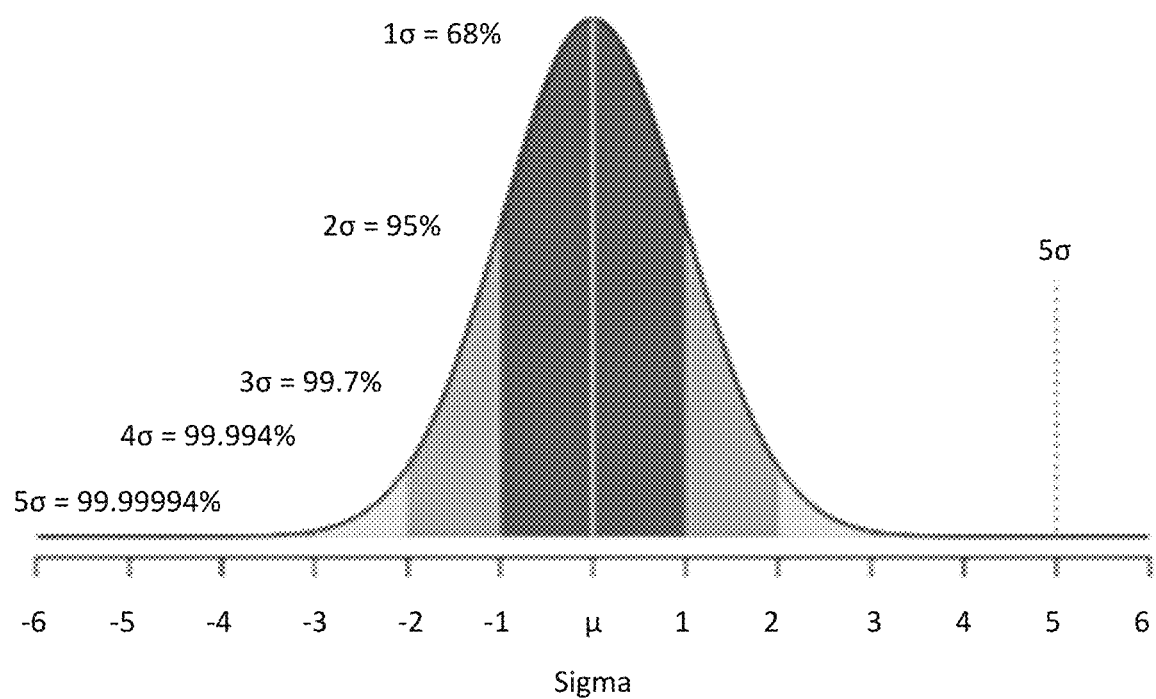
FIG. 5 is a diagram showing standard normal distribution.

For the standard normal distribution, about 68% of values are within one standard deviation ($\sigma$) away from the mean; about 95% of the values lie within two standard deviations; about 99.7% are within three standard deviations; and about 99.994% of the values are within four standard deviation, shows in FIG. 5.

Standard normal distribution is only one example. The embodiments disclosed herein are not limited to this distribution. Other distributions such as a Poisson distribution or a student's t distribution are possible. In addition, if the noise scan data does not obey the standard normal distribution, the statistical point based sigmas can be calculated based on the above model. The population can be counted from left and right of the histogram to the opposite direction. When it reaches the percentage of the known 4,3,1-sigma, it can be labeled as the limit of the statistical point-based sigma.

The mean, statistical point-based 1-sigma, 3-sigma and 4-sigma can be used for clustering. The 2-sigma can be ignored in the clustering algorithm because the 1-sigma and 3-sigma can cover the 2-sigma characteristic. The following steps can be implemented to get the clustered regions.

First, the sub-care area groups are clustered based on a mean value. The absolute value of mean is compared to a threshold. For example, the threshold can be set to a value of 2.0. If the value is greater than a threshold the care area will be put into one region. If the value is smaller than the threshold, it will be put into another region.

Then the sub-care area groups are clustered based on statistical point-based 1-sigma. The clustering is based on a distance of the sigma values of each care area group. Unsupervised machine learning clustering can be performed for each region that was generated. For example, K-means, hierarchical clustering, or other machine learning techniques can be used. Since the population is a factor for clustering, the population can be accumulated based on the 1-sigma. The population can then be sorted and fed into the unsupervised machine learning model. The region number can be estimated with the range of 1-sigma value. Usually the region number is set as $(\max(\sigma)-\min(\sigma))/(\text{grey level threshold})$.

The gray level threshold can be controlled by a coefficient to adjust the number of regions. For example, k-means clustering algorithm can be used and the gray level threshold can be set as four with coefficient as one. Other clustering techniques, such as variants of hierarchical clustering, are also possible.

Then, the sub-care area groups are clustered based on statistical point-based 3-sigma. This can be similar to clustering based on statistical point-based 1-sigma except the input regions and clustering criteria are changed. The inputs can be the first level clusters. The input regions are output of the previous step with clustering at the statistical point-based 1-sigma. The input to clustering model is the 3-sigma and their corresponding population.

Then the sub-care area groups clustered based on statistical point-based 4-sigma. This can be similar to clustering based on statistical point-based 3-sigma except the input regions and clustering criteria are changed. The inputs can be second level clusters. Clustering is based on statistical point-based 4-sigma and their corresponding population. The input regions are output of the previous step with clustering at the statistical point-based 3-sigma.

Figure 4:
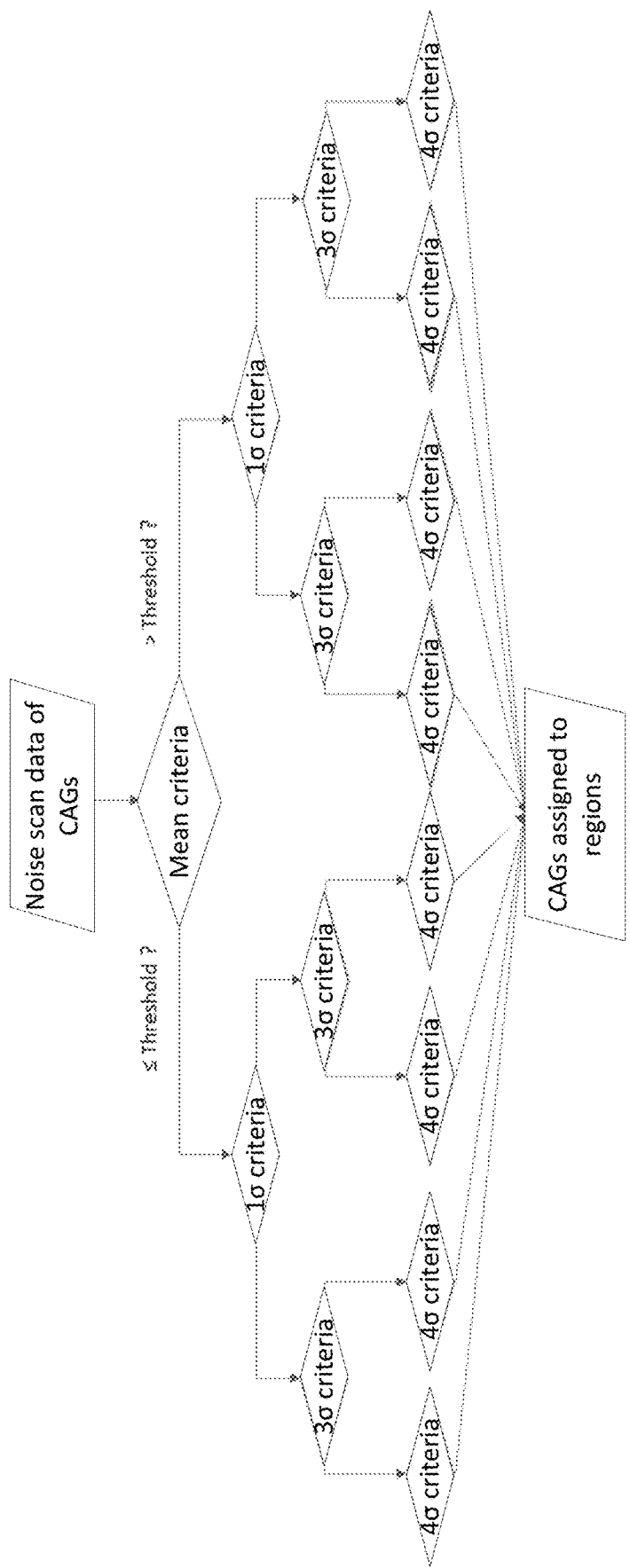
FIG. 4 is a diagram illustrating an exemplary flow of a clustering algorithm using 1-sigma, 3-sigma, and 4-sigma.

In the example above, the clustering algorithm can use these characteristics to cluster the sub-care area groups in four steps: mean→1-sigma→3-sigma→4-sigma in each die. If the population is less than a certain number (e.g., 150,000), the 4-sigma step can be ignored. 2-sigma is skipped in this example of the clustering algorithm. FIG. 4 is a diagram illustrating an exemplary flow of a clustering algorithm using 1-sigma, 3-sigma, and 4-sigma.

The statistical point-based sigma in this embodiment can better reflect the characteristic of the data. Previous techniques ignored the 3-sigma and 4-sigma, which have correlation to the defect detection. Previous techniques also ignored that population is a factor for clustering. A big population can dominate the region's distribution, so the region may only contain the sub-care area groups that have close sigma value and similar population.

While 3-sigma and 4-sigma are used in this example, other values or thresholds can be used instead. The sigma values disclosed herein are merely exemplary.

In the embodiments disclosed herein, the number of regions can be adjusted to satisfy the inspection requirement. After the 4-step clustering is accomplished, the final region numbers can be assigned to each sub-care area group and fed to the inspection work flow.

Consistency of the clustering in all the dies can be determined and outlier dies can be removed. Consistency can be determined if the clustering results agree with each other or, if not, a voting mechanism. The outlier dies can be caused by shot noise or other process variation. Such outlier dies can impact the characteristic of the target care area. Removing outlier dies can improve the data purity and the sensitivity of the defect detection. Outlier dies can be removed by ignoring the clustering results of the outlier dies.

All the dies can then merged for final clustering. Merging all the dies can eliminate the difference between dies and can avoid the pixel insufficiency (e.g., for 4-sigma calculations). After the outlier dies are removed, die data is combined or otherwise assembled and statistical information is calculated.

Note that this disclosure is not limited to a certain statistical moment. Any of the disclosed statistical moments or their combinations can also be used for grouping those care areas. For example, skewness and kurtosis can be used for grouping. In another example, K-means clustering can be applied to group the care areas. However, these are only examples. Other statistical methods and their combination can be used depending on behaviors of the distributions and/or presence of outliers.

In an embodiment, the grey scale value is divided evenly and the sub-care area groups are clustered based on the subset of the grey scale.

In another embodiment, Kernel Density Estimator (KDE) is used for clustering. KDE can cluster sigma values that are close with each other. However, KDE is only one example. Other techniques can be used.

In a second embodiment, a noise cloud is used for clustering. A noise cloud is a noise density distribution, such as a 2D histogram. The expectation is that each sub-care area produces smaller and more coherent noise clouds after optical inspection. This helps small defects stand out in the noise cloud and reduce the probability of being shadowed by a bigger noise cloud from another sub-care area. Statistics may be determined to decide if a pixel is a defect candidate or not. These statistics are can be calculated from the noise cloud obtained in a sub-care area, but can be challenging to accurately determine due to data insufficiency. Since the number of pixels in a sub-care area is smaller than the number of pixels in the original care-area by a factor of thousands, a few tens of pixels remain to form the noise cloud. This can make the determination more difficult. A clustering method can be used to cluster similar sub-care areas together such that it has minimum effect on sensitivity and overcomes data insufficiency.

After a care area is divided into a set of sub-care areas, a noise scan can be performed on the sample plan, which can be the entire die row. There may be thousands of sub-care areas used for the noise scan. The care area can be divided based on the shape and/or size of the polygons. Statistics can be collected from the noise scan. These statistics can be defined based on a detection algorithm. In an instance, the gray level is split into segments and the distribution is modeled for each segment using the first few moments.

Among thousands of sub-care areas, there may be a few sub-care areas that are noisy. In an instance, noisy is means that the values in the difference (diff) images for them are widely spread. An objection of this embodiment is to avoid polluting other sub-cares area by clustering them with the noisy sub-care areas. To detect noisy sub-care areas, the bandwidth of the overall histogram in the diff axes may be determined. Then, among the bandwidths, the noisy sub-care areas are found if their bandwidth falls outside of the population as an outlier.

Figure 6:
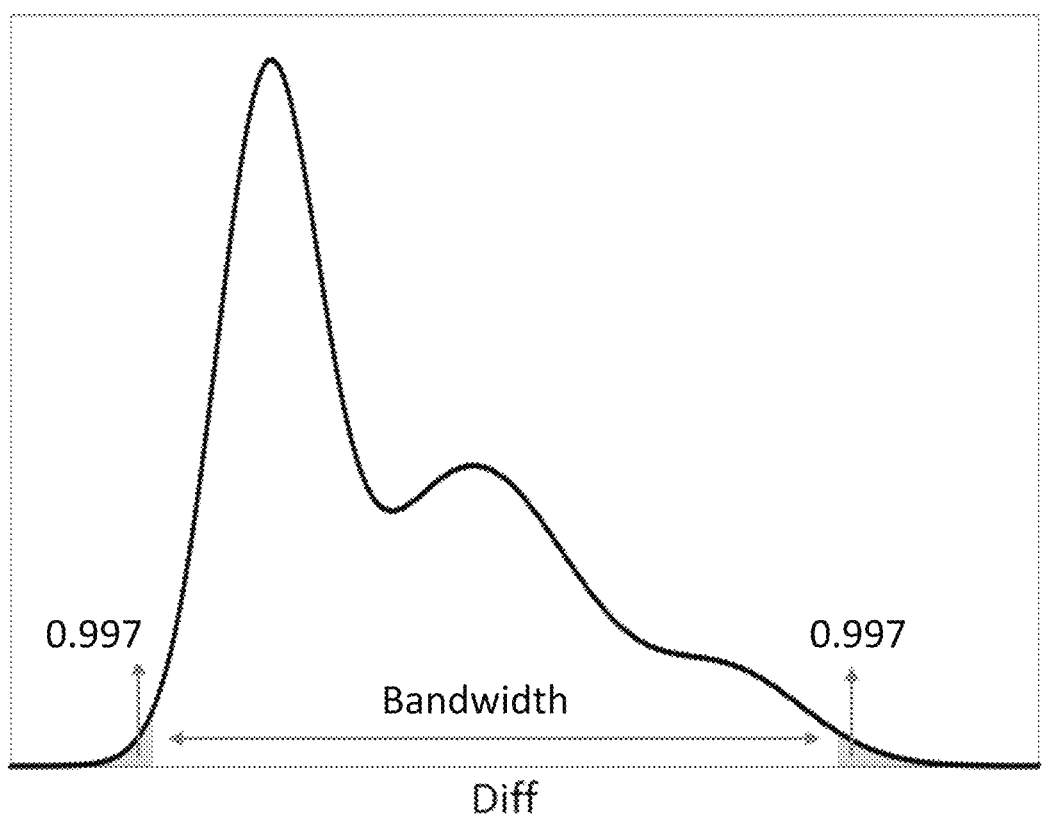
FIG. 6 illustrates bandwidth in a histogram.

Bandwidth of the histogram is the distance between the density points from each end of the histogram, which is shown in FIG. 6.

Figure 7:
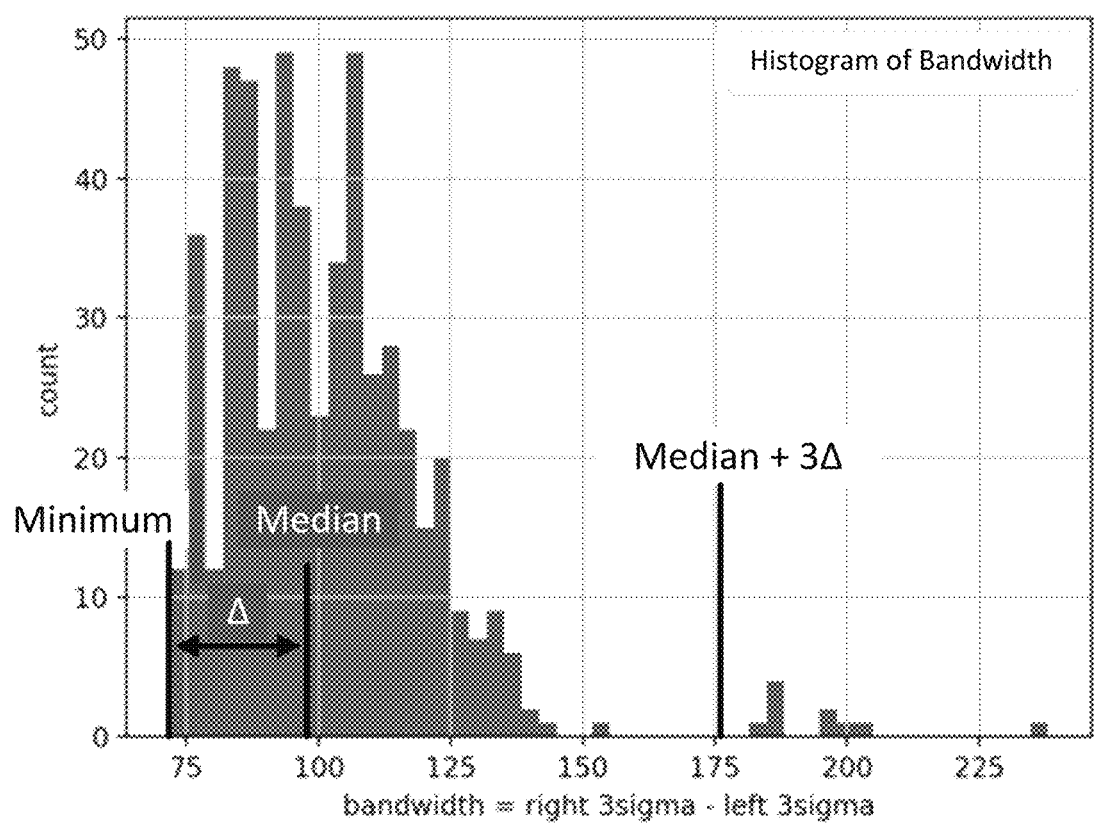
FIG. 7 illustrates detecting noisy sub-care areas.

In an instance, the sub-care areas can be marked as noisy if their bandwidth falls after the median plus $3\Delta$, wherein $\Delta$ is the median minus the minimum. For example, see FIG. 7.

Figure 8:
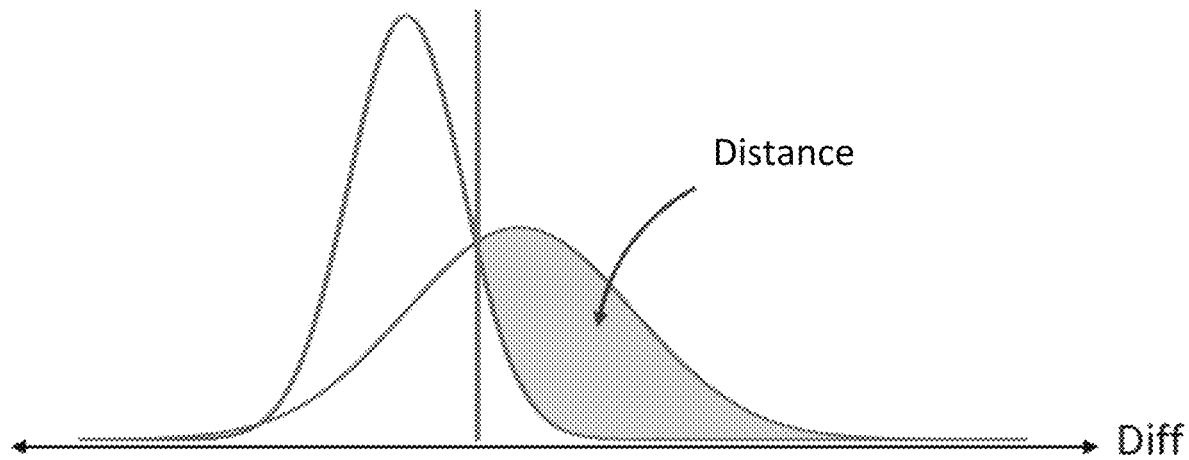
FIG. 8 illustrates a distance between two distributions.

An objective for clustering is to have the minimum impact on sensitivity. To achieve this, two sub-care areas can be combined if the detectability of the defects in either of these sub-care areas does not degrade after clustering. The distance between two distributions can be defined to be the biggest difference between the detected population portions of the two among all possible detection cutlines. For example, this is shown in FIG. 8.

Figure 9:
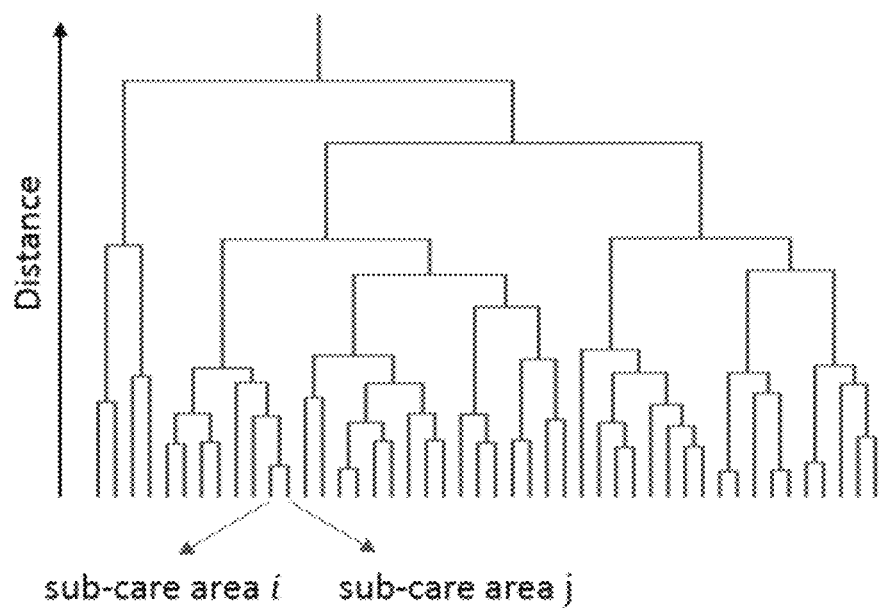
FIG. 9 is a diagram showing an exemplary clustering layout combining sub-care areas.

After evaluating a distance between two sub-care areas (e.g., every two sub-care areas), a dendrogram can be used to create the clustering layout. A complete linking method can be used to minimize sensitivity loss. FIG. 9 shows an example of this layout.

Figure 10:
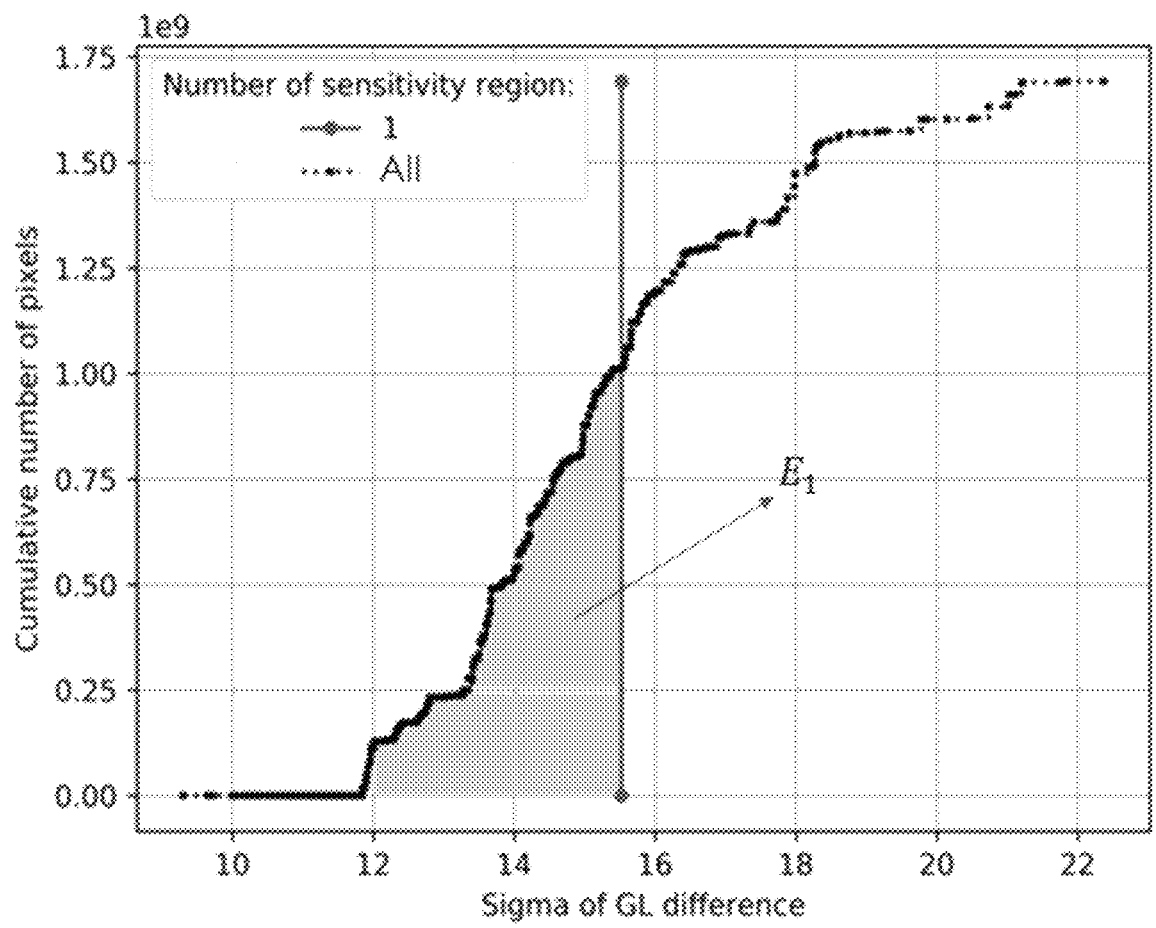
FIGS. 10-12 illustrate a cumulative number of pixels versus sigma of gray level diff.
Figure 11:
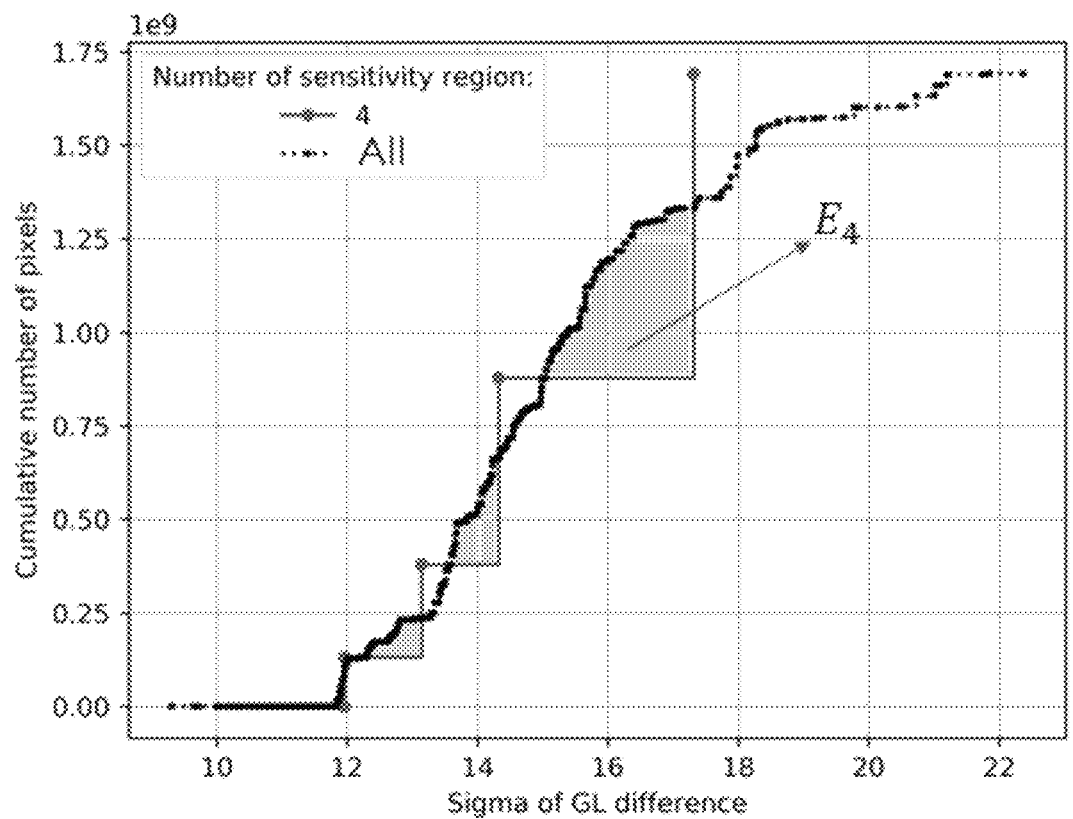
Figure 12:
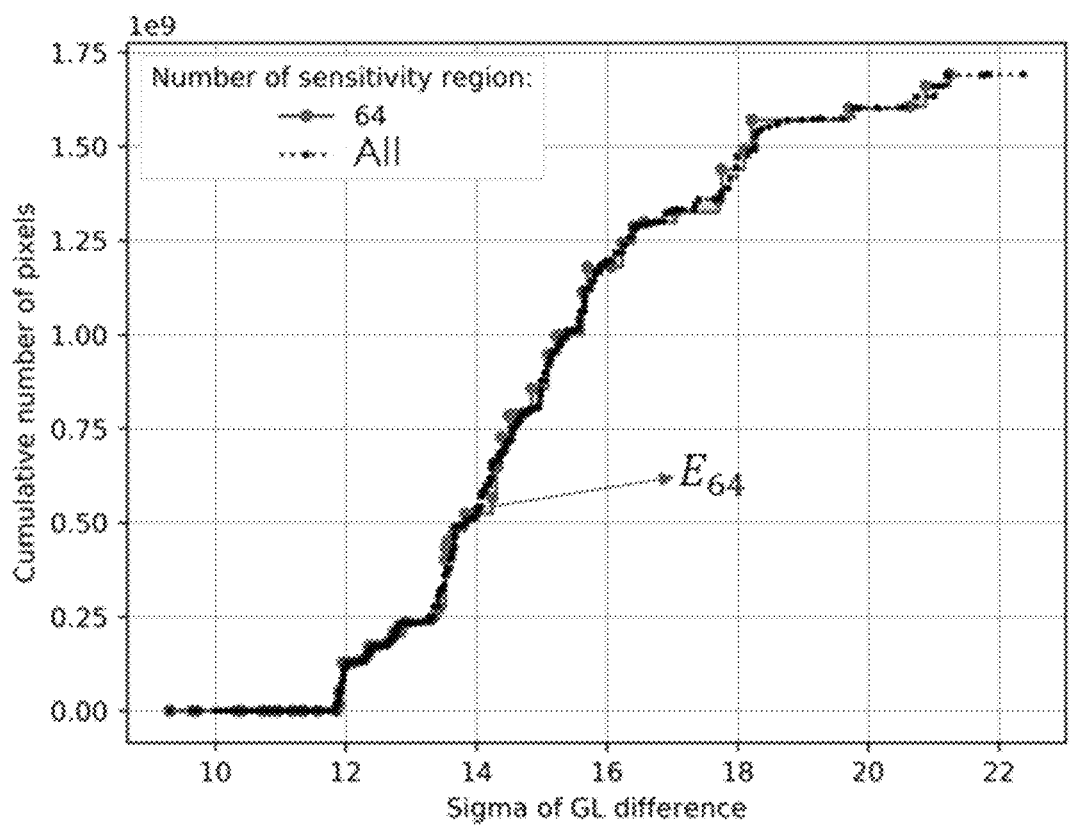

A graph of "cumulative number of pixels" versus "sigma of gray level diff" is shown in FIGS. 10-12. This comparison between cumulative number of pixels versus sigma of the gray level diff can be used to determine a number of clusters. Absolute error $E_k$ can be defined to be the "area loss" between the curve when not applying any clustering and the curve when clustering into k regions, which is shown in FIGS. 10-12.

The error can be large when all the sub-care areas are put in one region. However, error improves as the number of clusters is increased. Normalized error can be calculated as follows.

$$\text{normalized error}[k]=E_k/E_1$$

Figure 13:
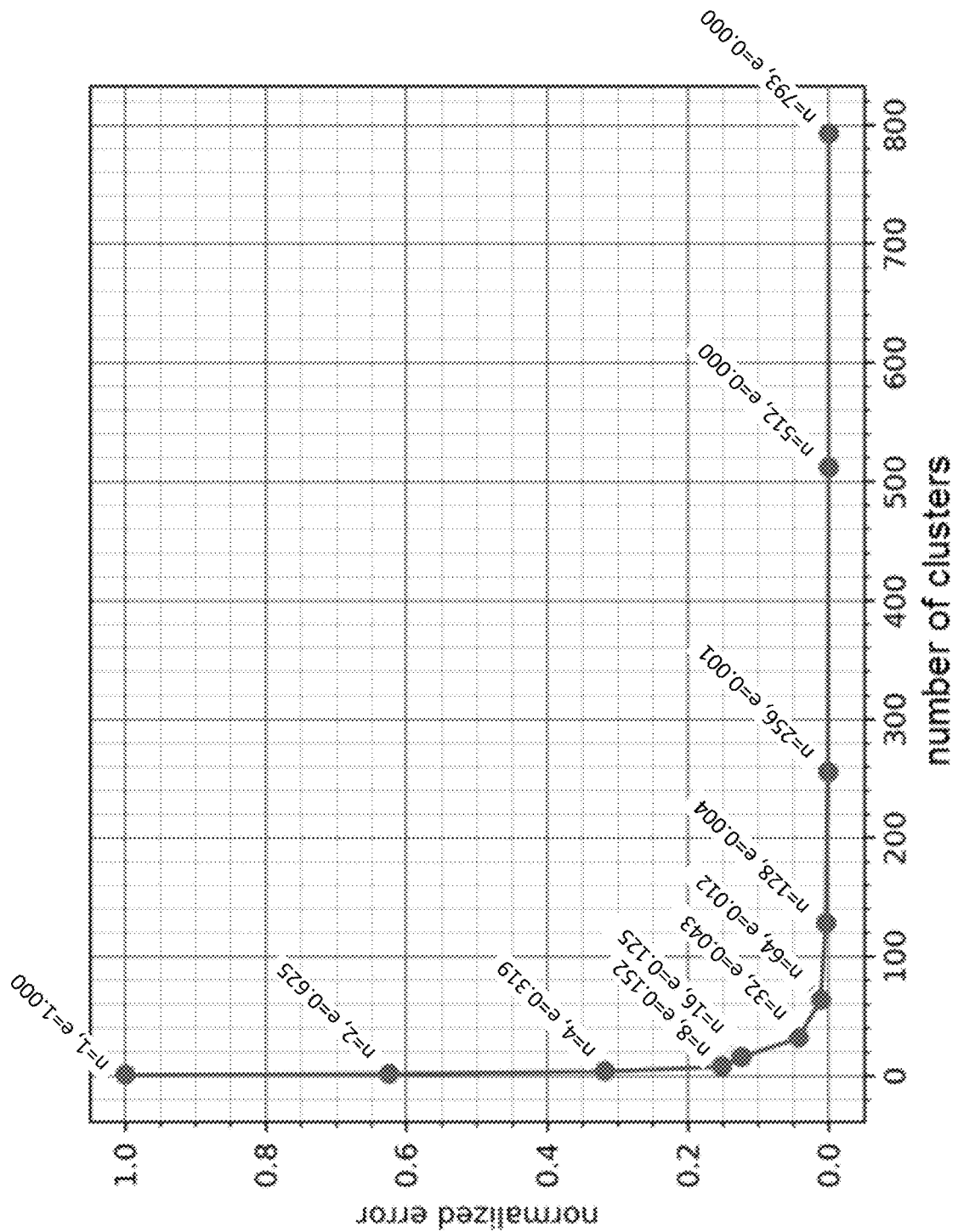
FIG. 13 illustrates normalized error versus a number of clusters.

$E_k$ is the error when you have k clusters, which is shown in FIG. 13. $E_1$ is the error when the cluster number is one (i.e., everything is put into one cluster).

Plotting the normalized error versus number of clusters, k, can provide an exponentially decaying curve as shown in FIG. 13.

Figure 14:
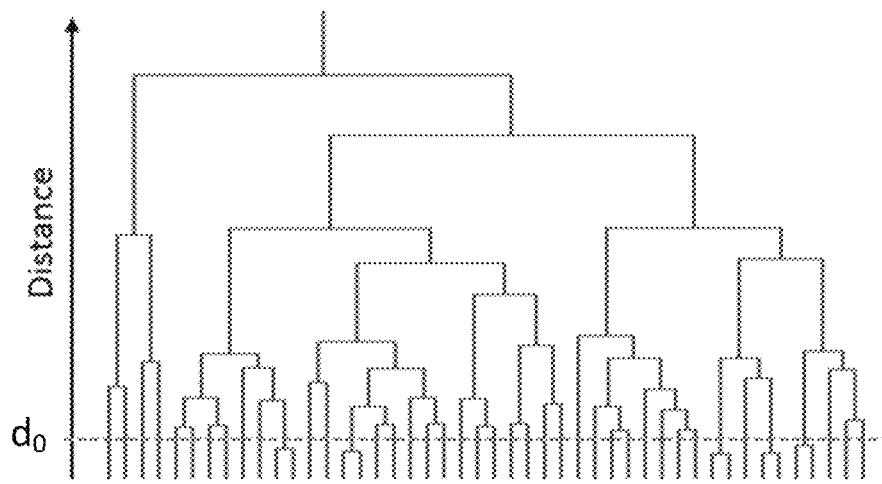
FIG. 14 illustrates a first cutline on a dendrogram based on the initial distance.

The normalized error vanishes quickly and there is not much gain by moving to larger numbers of clusters. The number of clusters can be translated to a distance value. The initial distance, $d_0$, can be defined to be the equivalent distance for the number of clusters that is acceptable. This distance can be adjusted further according to throughput constraints on the maximum number of clusters. The dendrogram can be cut at $d_0$ and create the initial clusters. This is shown in FIG. 14.

Figure 15:
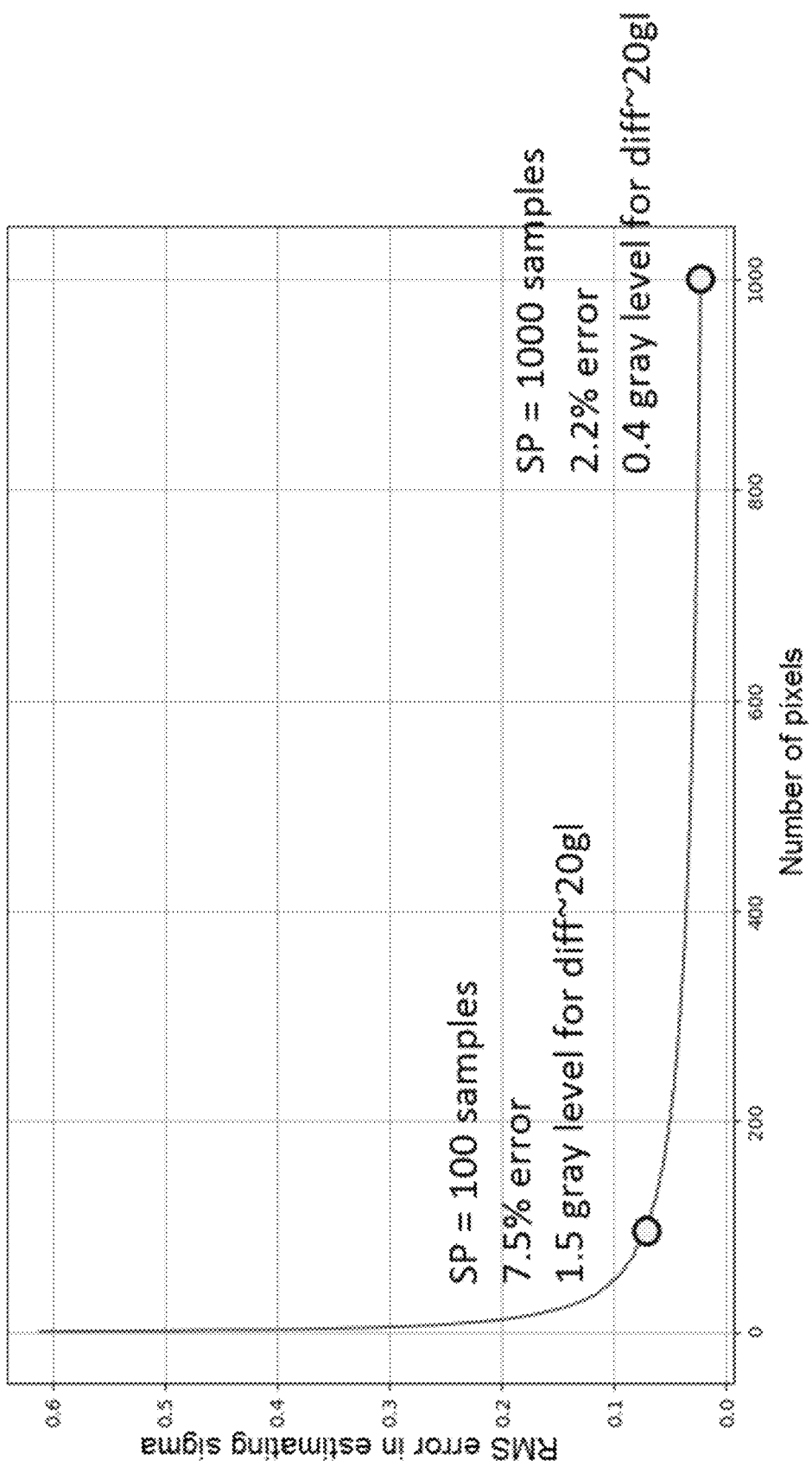
FIG. 15 is a diagram showing root mean square (RMS) error estimating standard deviation for different numbers of pixels.

A sparsity point (SP) can be defined to be the minimum number of pixels that are required in a frame to be able to obtain meaningful statistics. FIG. 15 shows the RMS error in estimating the standard deviation from a Gaussian distribution for different numbers of pixels. In FIG. 15, "gl" is grey level. It marks the RMS error if SP is set to 100 and 1000 pixels.

A sparsity ratio (SR) of a cluster within a die can be defined as follows. Cluster A is a particular cluster.

sparsity ratio(SR) of cluster A=number of frames with 0<number of pixel from A<SP/number of frames that have pixels from A The maximum sparsity ratio (MSR) would be the threshold that all the clusters' SR must be below.

Figure 16:
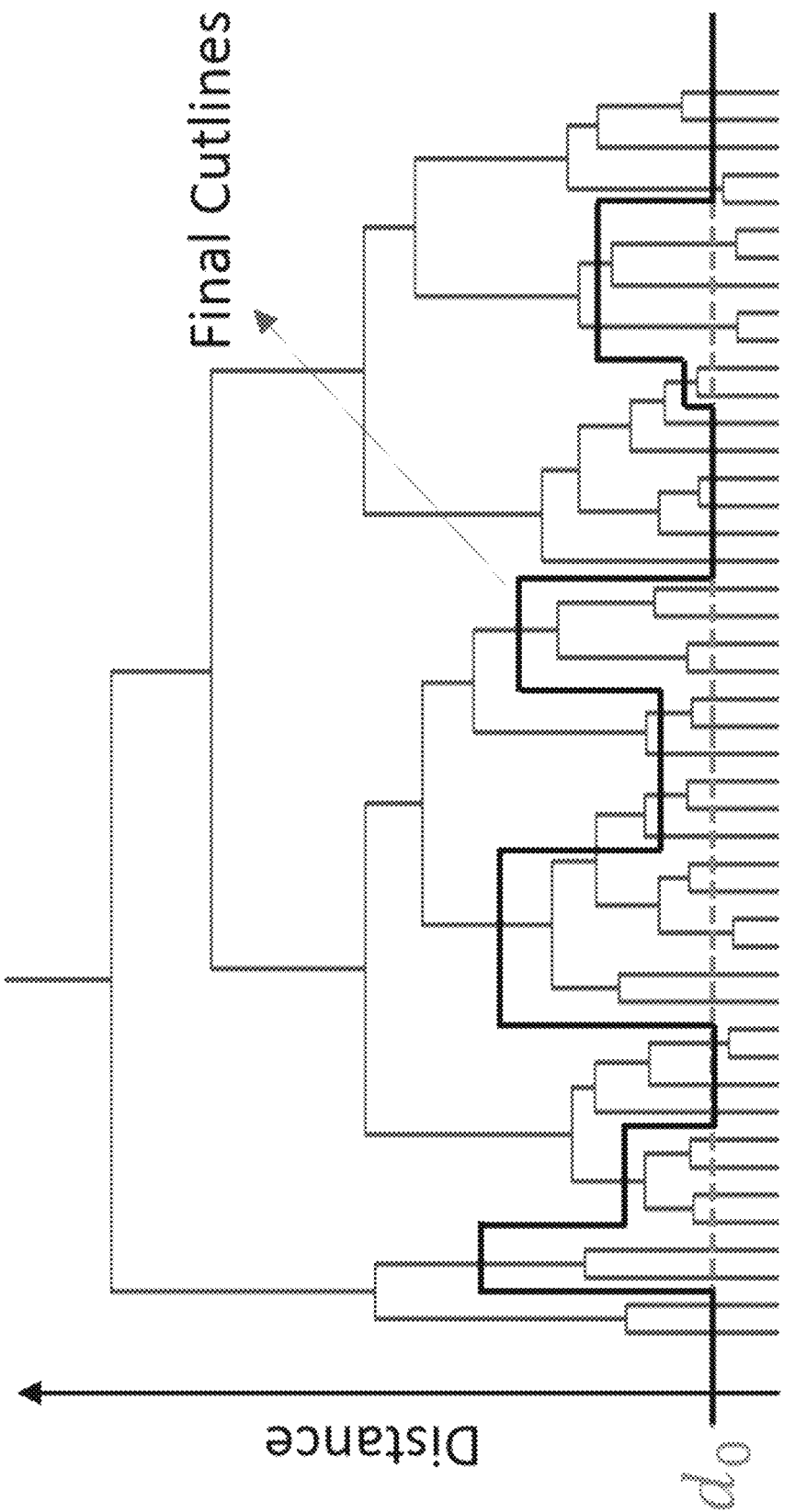
FIG. 16 illustrates a final dendrogram cutline.

The algorithm can move the cutline up the dendrogram at uneven different levels until it reaches the points that all the clusters satisfy the data sufficiency constraint, which can be determined from the pixel count in the cluster. FIG. 16 shows the results of such a clustering. As shown, some of the initial clusters satisfy the data sufficiency constraint but for the others the algorithm moved the cutlines up.

Figure 17:
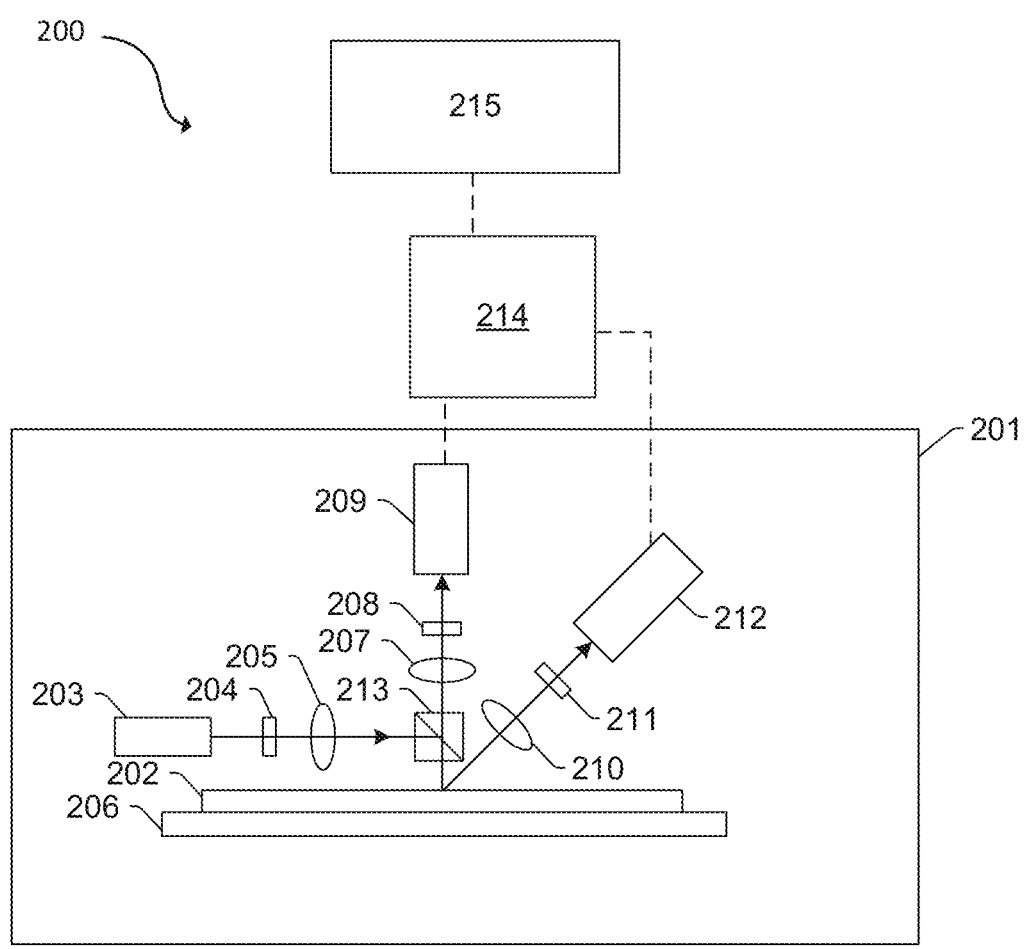
FIG. 17 is a diagram of an embodiment of a wafer inspection tool in accordance with the present disclosure.

One embodiment of a system 200 is shown in FIG. 17. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen 202 includes a reticle. The reticle may include any reticle known in the art.

In the embodiment of the system 200 shown in FIG. 17, optical based subsystem 201 includes an illumination subsystem configured to direct light to specimen 202. The illumination subsystem includes at least one light source. For example, as shown in FIG. 17, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 17, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 17. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 17 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 17) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 17 as a single refractive optical element, it is to be understood that, in practice, lens 205 may include a number of refractive and/or reflective optical elements that in combination focus the light from the optical element to the specimen. The illumination subsystem shown in FIG. 17 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 17 includes two detection channels, one formed by collector 207, element 208, and detector 209 and another formed by collector 210, element 211, and detector 212. As shown in FIG. 17, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 17, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 17 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 17 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 17 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 17 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with an SEM.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to receive an image of the semiconductor wafer using data from the detector and determine a care area in the image. The care area is divided into sub-care areas based on shapes of polygons in a design file associated with the care area. A noise scan of a histogram is performed for the sub-care areas. The sub-care areas can be clustered into groups based on the noise scan of the histogram. Other embodiments of the method 100 can be performed.

An additional embodiment relates to a non-transitory computer-readable medium storing program instructions executable on a controller for performing a computer-implemented method for clustering sub-care areas, as disclosed herein. In particular, as shown in FIG. 17, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   generating an image of a semiconductor wafer using a wafer inspection tool;
   receiving, at a processor, the image of the semiconductor wafer;
   determining, using a processor, a care area in the image;
   dividing the care area into sub-care areas using the processor based on shapes of polygons in a design file associated with the care area;
   performing a noise scan of a histogram for the sub-care areas using the processor, wherein the noise scan of the histogram is based on a difference image between the image and a reference image at the sub-care area; and clustering the sub-care areas into groups using the processor based on the noise scan of the histogram.

2. The method of claim 1, further comprising determining, using the processor, if a defect is present at a pixel of one of the sub-care areas.

3. The method of claim 1, wherein the clustering further includes:

determining a bandwidth of the histogram between density points at each end of the histogram using the processor; and determining a median, a maximum, and a minimum of the bandwidth using the processor.

4. The method of claim 3, wherein the clustering further includes:

generating a dendrogram based on the groups; and adjusting a cutline on the dendrogram until all groups satisfy a data sufficiency constraint.

5. The method of claim 1, wherein the clustering further includes:

determining a mean, a first threshold, and a second threshold of the noise scan, wherein the first threshold and the second threshold are less than 4-sigma from the mean;

clustering the sub-care areas for each die into a first category between the mean and first threshold and a second category between the first threshold and second threshold; and determining consistency of populations based on the clustering using the processor.

6. The method of claim 5, further comprising merging dies of the sub-care areas using the processor.

7. The method of claim 5, wherein the first threshold and the second threshold are each one of 1-sigma, 3-sigma, and 4-sigma.

8. The method of claim 7, wherein the clustering further includes:

clustering the groups with a statistical point-based 1-sigma to generate a first output;

clustering the first output with a statistical point-based 3-sigma to generate a second output; and clustering the second output with a statistical point-based 4-sigma.

9. The method of claim 1, wherein the determining the group of sub-care areas is across a row of dies on the semiconductor wafer.

10. The method of claim 1, further comprising combining two of the sub-care areas, wherein detectability of the two of the sub-care areas is approximately unchanged after the combining.

11. A non-transitory computer readable medium storing a program configured to instruct a processor to execute the method of claim 1.

12. A system comprising:

a light source;

a stage configured to hold a semiconductor wafer;

a detector configured to receive light from the light source reflected off the semiconductor wafer; and a processor in electronic communication with the detector, wherein the processor is configured to:

receive an image of the semiconductor wafer using data from the detector;

determine a care area in the image;

divide the care area into sub-care areas based on shapes of polygons in a design file associated with the care area;

perform a noise scan of a histogram for the sub-care areas, wherein the noise scan of the histogram is based on a difference image between the image and a reference image at the sub-care area; and cluster the sub-care areas into groups based on the noise scan of the histogram.

13. The system of claim 12, wherein the processor is further configured to determine if a defect is present at a pixel of one of the sub-care areas.

14. The system of claim 12, wherein the clustering further includes:

determining a bandwidth of the histogram between density points at each end of the histogram using the processor; and determining a median, a maximum, and a minimum of the bandwidth using the processor.

15. The system of claim 12, wherein the clustering further includes:

determining a mean, a first threshold, and a second threshold of the noise scan, wherein the first threshold and the second threshold are less than 4-sigma from the mean;

clustering the sub-care areas into a first category between the mean and first threshold and a second category between the first threshold and second threshold; and determining consistency of populations based on the clustering using the processor.

16. The system of claim 15, wherein the first threshold and the second threshold are each one of 1-sigma, 3-sigma, and 4-sigma.

17. The system of claim 16, wherein the clustering further includes:

clustering the groups with a statistical point-based 1-sigma to generate a first output;

clustering the first output with a statistical point-based 3-sigma to generate a second output; and clustering the second output with a statistical point-based 4-sigma.

18. The system of claim 12, wherein the determining the group of sub-care areas is across a row of dies on the semiconductor wafer.

19. The system of claim 12, wherein the processor is further configured to combine two of the sub-care areas, wherein detectability of the two of the sub-care areas is approximately unchanged after the combining.

* * * * *